(12) United States Patent
Song

(10) Patent No.: US 7,645,670 B2
(45) Date of Patent: Jan. 12, 2010

(54) METHOD FOR FABRICATING NONVOLATILE MEMORY DEVICE

(75) Inventor: Young-Taek Song, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 140 days.

(21) Appl. No.: 11/859,792

(22) Filed: Sep. 24, 2007

(65) Prior Publication Data

US 2008/0138951 A1    Jun. 12, 2008

(30) Foreign Application Priority Data

Sep. 29, 2006  (KR) ...................... 10-2006-0096453
Sep. 7, 2007   (KR) ...................... 10-2007-0090872

(51) Int. Cl.
*H01L 21/336* (2006.01)
(52) U.S. Cl. ................ 438/257; 438/296; 257/E21.179
(58) Field of Classification Search ......... 438/257–267, 438/296; 257/E21.179
See application file for complete search history.

(56) References Cited

U.S. PATENT DOCUMENTS 5,907,775 A * 5/1999 Tseng ........................ 438/261

6,903,406 B2 * 6/2005 Lee et al. .................... 257/315

FOREIGN PATENT DOCUMENTS

KR    1020040008528 A    1/2004
WO    WO 2006/012163 A1  2/2006

\* cited by examiner

*Primary Examiner*—Richard A. Booth
(74) *Attorney, Agent, or Firm*—Townsend and Townsend and Crew LLP

(57) ABSTRACT

A method for fabricating a nonvolatile memory device includes forming a tunneling insulation layer, a first conductive layer for forming a floating gate, and a hard mask over a substrate. A portion of the hard mask, the first conductive layer, the tunneling insulation layer, and the substrate is etched to form a trench. An isolation structure is formed to fill in the trench. The etched hard mask is removed such that an upper portion of the isolation structure protrudes above the etched first conductive layer. A dielectric layer is formed over the etched first conductive layer. A second conductive layer for forming a control gate is formed over the isolation structure and the dielectric layer. The second conductive layer is polished to align an upper surface of the second conductive layer using an upper surface of the isolation structure.

14 Claims, 10 Drawing Sheets

METHOD FOR FABRICATING NONVOLATILE MEMORY DEVICE

CROSS-REFERENCE TO RELATED APPLICATIONS

The present invention claims priority of Korean patent application numbers 2006-0096453 and 2007-0090872, filed on Sep. 29, 2006 and Sep. 7, 2007, respectively, which are incorporated by reference in their entirety.

BACKGROUND OF THE INVENTION

The present invention relates to a method for fabricating a semiconductor device, and more particularly, to a method for fabricating a nonvolatile memory device.

A NAND-type flash memory device, i.e., a nonvolatile memory device, comprises a unit string including a plurality of cells coupled in series for a large scale of integration. Applicable fields of the NAND-type flash memory device are extending to replace memory sticks, universal serial bus (USB) drivers, and hard disks.

Currently, when fabricating the NAND-type flash memory device, a method for forming a floating gate uses an advanced self aligned-shallow trench isolation (ASA-STI) process because of a decrease in an overlay margin between an active region and the floating gate.

FIGS. 1A to 1E illustrate cross-sectional views of a typical ASA-STI process.

Referring to FIG. 1A, a tunneling insulation layer 101 and a first conductive layer 102 for forming a floating gate are formed over a substrate 100.

Referring to FIG. 1B, portions of the tunneling insulation layer 101, the first conductive layer 102, and the substrate 100 are etched to form trenches 103. Accordingly, an active region in a line shape is defined. Thus, a patterned tunneling insulation layer 101A, a patterned first conductive layer 102A, and a patterned substrate 100A are formed.

Referring to FIG. 5C, an isolation structure 104 is filled in the trenches 103 (FIG. 1B).

Referring to FIG. 1D, the isolation structure 104 is recessed to a certain depth to adjust an effective field oxide height (EFH). Thus, a patterned isolation structure 104A is formed. The EFH refers to a distance from a top surface of the active region defined by the patterned isolation structure 104A to a dielectric layer 105 (FIG. 1E) to be formed by a subsequent process.

As shown in FIG. 1E, the dielectric layer 105 is formed over the surface profile of the patterned first conductive layer 102A including the patterned isolation structure 104A. A second conductive layer 106 for forming a control gate is formed over the dielectric layer 105.

Although not shown, the second conductive layer 106 for a control gate, the dielectric layer 105, and the patterned first conductive layer 102A are etched in a direction perpendicular to the active region to form the floating gate and the control gate.

In the typical ASA-STI process including the etch process to adjust the EFH as shown in FIG. 1D, a height difference between the patterned isolation structure 104A and the patterned first conductive layer 102A is generated. When the second conductive layer 106 for forming the control gate is formed as shown in FIG. 1E, the height difference in lower layers is mirrored in the conductive layer 106. The height difference causes a height non-uniformity among memory cell gates in a wafer and may have an effect on the etch process for forming the control gate. Also, this height difference is mirrored in upper layers of the control gate and may have an effect on a subsequent process. As a result, device characteristics may be deteriorated.

SUMMARY OF THE INVENTION

Embodiments of the present invention are directed to provide a method for fabricating a nonvolatile memory device, which can overcome non-uniformity between memory cells in a wafer, generated by a height difference of a control gate.

In accordance with an aspect of the present invention, there is provided a method for fabricating a nonvolatile memory device. The method includes forming a tunneling insulation layer, a first conductive layer for forming a floating gate, and a hard mask over a substrate. A portion of the hard mask, the first conductive layer, the tunneling insulation layer, and the substrate is etched to form a trench. An isolation structure is formed to fill in the trench. The etched hard mask is removed such that an upper portion of the isolation structure protrudes above the etched first conductive layer. A dielectric layer is formed over the etched first conductive layer. A second conductive layer for forming a control gate is formed over the isolation structure and the dielectric layer. The second conductive layer is polished to align an upper surface of the second conductive layer using an upper surface of the isolation structure.

In accordance with another aspect of the present invention, there is provided a method for fabricating a nonvolatile memory device. The method includes forming a tunneling insulation layer, a first conductive layer for forming a floating gate, a dielectric layer, and a second conductive layer for forming a control gate over a substrate. A portion of the second conductive layer, the dielectric layer, the first conductive layer, the tunneling insulation layer, and the substrate is etched to form a trench. An isolation structure is formed over the etched second conductive layer and fills in the trench. The isolation structure is polished to align an upper surface of the isolation structure using an upper surface of the etched second conductive layer.

DESCRIPTION OF SPECIFIC EMBODIMENTS

Figure 1A:
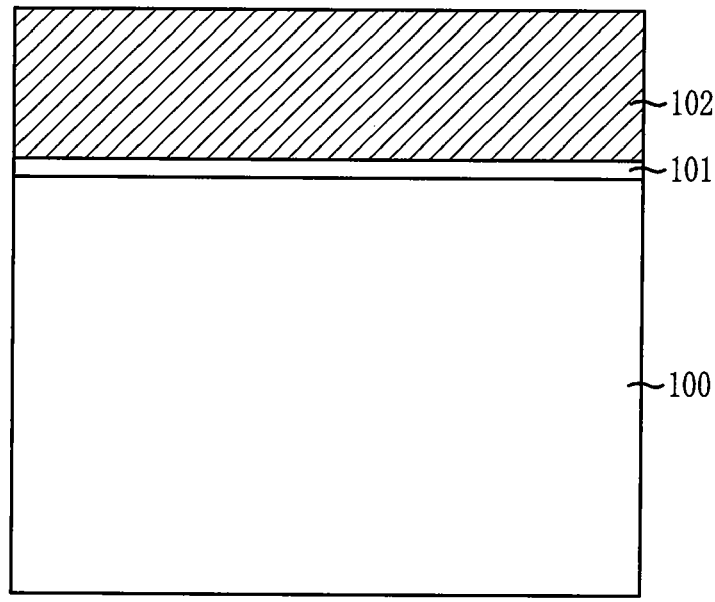
FIGS. 1A to 1E illustrate cross-sectional views of a typical ASA-STI process.
Figure 1B:
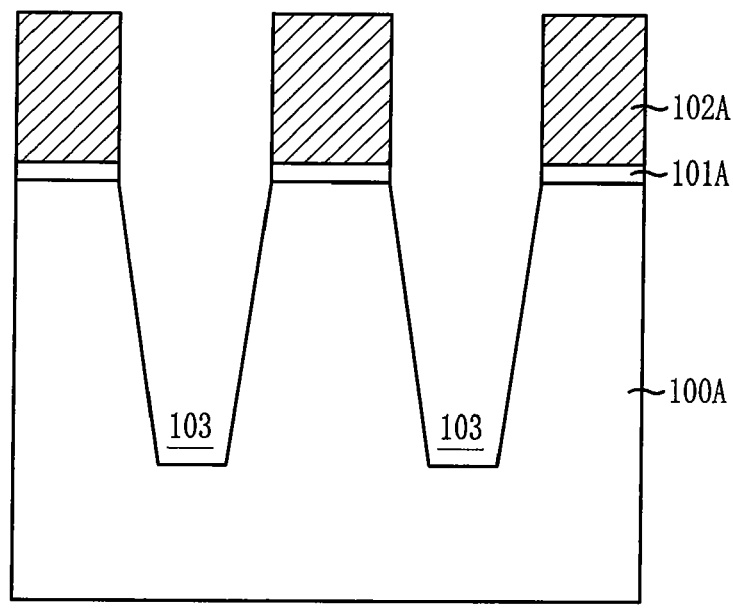
Figure 1C:
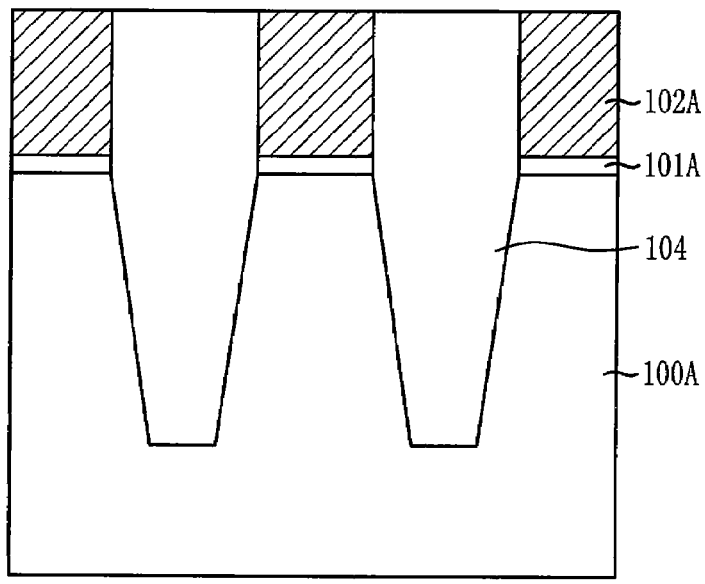
Figure 1D:
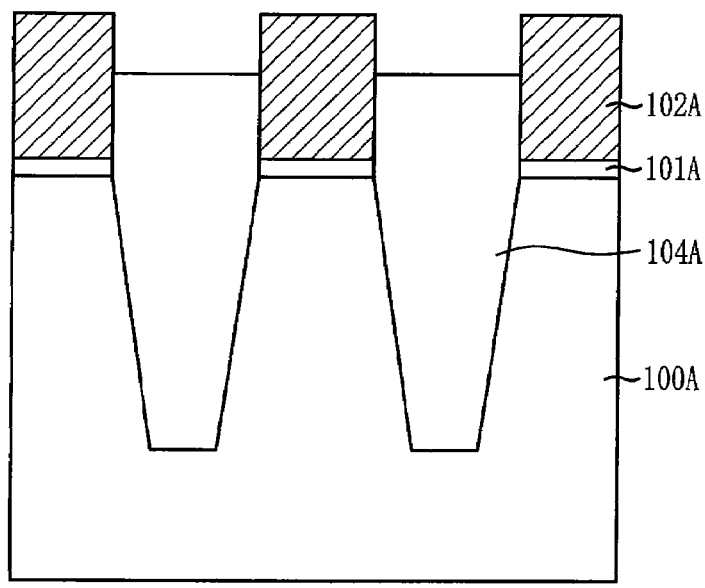
Figure 1E:
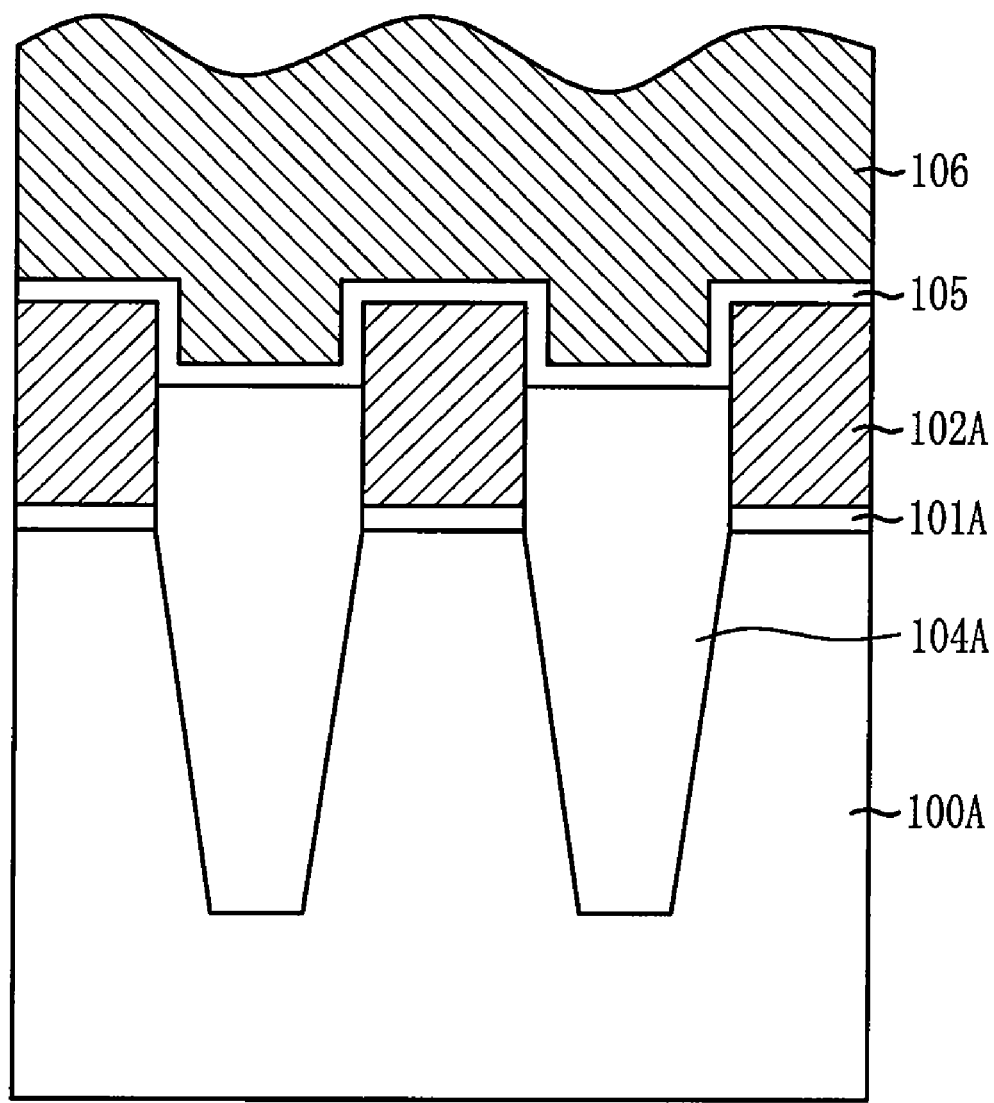

Embodiments of the present invention relate to a method for fabricating a nonvolatile memory device.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or between the first layer and the substrate. Furthermore, the same or like reference numerals throughout the various embodiments of the present invention represent the same or like elements in different drawings.

FIGS. 2A to 2G illustrate cross-sectional views in a word line direction of a method for fabricating a nonvolatile memory device in accordance with a first embodiment of the present invention.

Figure 2A:
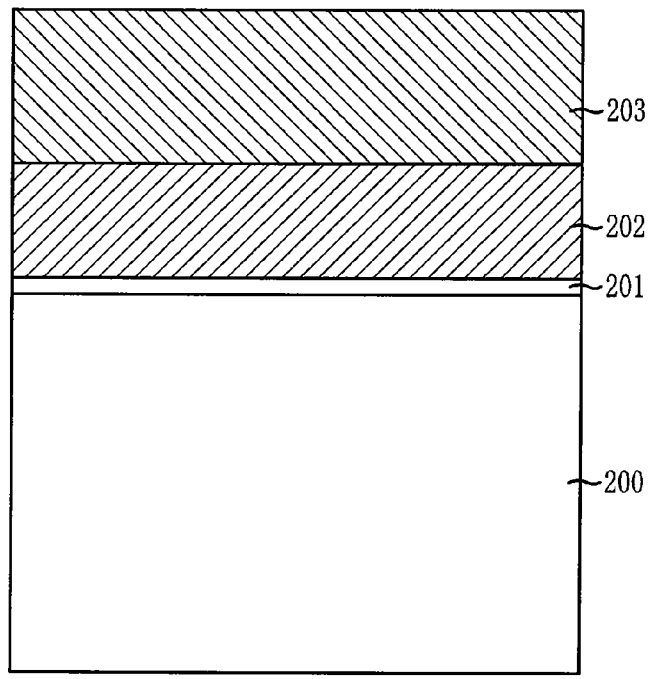
FIGS. 2A to 2G illustrate cross-sectional views in a word line direction of a method for fabricating a nonvolatile memory device in accordance with a first embodiment of the present invention.

Referring to FIG. 2A, a substrate 200 is formed. For instance, the substrate is formed by forming a triple n-type well (not shown) and a p-type well (not shown) in a p-type substrate. An ion implantation process for adjusting a threshold voltage of a channel region in the p-type well is performed.

A tunneling insulation layer 201 is formed over the substrate 200. A fouler-nordheim (F—N) tunneling occurs in the tunneling insulation layer 201. The tunneling insulation layer 201 includes an oxide-based layer. For instance, the tunneling insulation layer 201 includes a silicon oxide ($SiO_2$) layer. Also, the tunneling insulation layer 201 may include a nitride-based layer. For instance, the nitride-based layer is formed by forming a silicon oxide layer and performing a thermal treatment process using nitrogen ($N_2$) gas to form the nitride-based layer on an interface between the silicon oxide layer and the substrate 200. Besides the oxide-based and nitride-based layers, the tunneling insulation layer 201 may include a metal oxide. For instance, the metal oxide includes a high-k dielectric layer having a dielectric constant of approximately 3.9 or greater such as an aluminum oxide layer ($Al_2O_3$), a hafnium oxide ($HfO_2$) layer, and a zirconium oxide ($ZrO_2$) layer. The tunneling insulation layer 201 is formed to a thickness ranging from approximately 50 Å to approximately 100 Å.

A first conductive layer 202, functioning as a floating gate, is formed over the tunneling insulation layer 201. The first conductive layer 202 may include poly-crystalline silicon (Si), a transition metal, or a rare earth metal and is formed to a thickness ranging from approximately 800 Å to approximately 1,000 Å. For instance, a poly-crystalline silicon layer includes an undoped poly-crystalline silicon layer, which is not doped with impurity ions, or a doped poly-crystalline silicon layer, which is doped with impurity ions. The undoped poly-crystalline silicon layer is doped by implanting impurity ions through a subsequent ion implantation process.

The poly-crystalline silicon layer is formed using a low pressure chemical vapor deposition (LPCVD) process. A source gas includes Silane ($SiH_4$) gas. A doping gas may include phosphine ($PH_3$) gas, boron trichloride ($BCl_3$), or diborane ($B_2H_6$) gas. The transition metal may include iron (Fe), cobalt (Co), tungsten (W), nickel (Ni), palladium (Pd), platinum (Pt), molybdenum (Mo), or titanium (Ti). A rare earth metal may include erbium (Er), ytterbium (Yb), samarium (Sm), yttrium (Y), lanthanum (La), cerium (Ce), terbium (Tb), dysprosium (Dy), holmium (Ho), thulium (Tm), or lutetium (Lu).

A buffer layer (not shown) may be formed over the first conductive layer 202. The buffer layer is formed to reduce damage to the first conductive layer 202 during a subsequent forming and removing processes of a hard mask 203. The buffer layer includes a material having a high etch selectivity ratio to the hard mask 203. For instance, a silicon oxide layer is used as the buffer layer when the hard mask 203 includes a nitride layer, e.g., a silicon nitride layer ($Si_3N_4$).

The hard mask 203 is formed over the first conductive layer 202. The hard mask 203 is formed to compensate for a lack of thickness of a subsequent photoresist pattern (not shown). The hard mask 203 includes a material having a high etch selectivity ratio to the first conductive layer 202 when the buffer layer is not formed. For instance, when the first conductive layer 202 includes a poly-crystalline silicon layer, the hard mask 203 includes a silicon nitride layer, a stack structure configured with a silicon nitride layer and a silicon oxynitride (SiON) layer, or a stack structure configured with a silicon nitride layer and a silicon oxide layer. The hard mask 203 is formed to a thickness ranging from approximately 1,000 Å to approximately 5,000 Å.

Figure 2B:
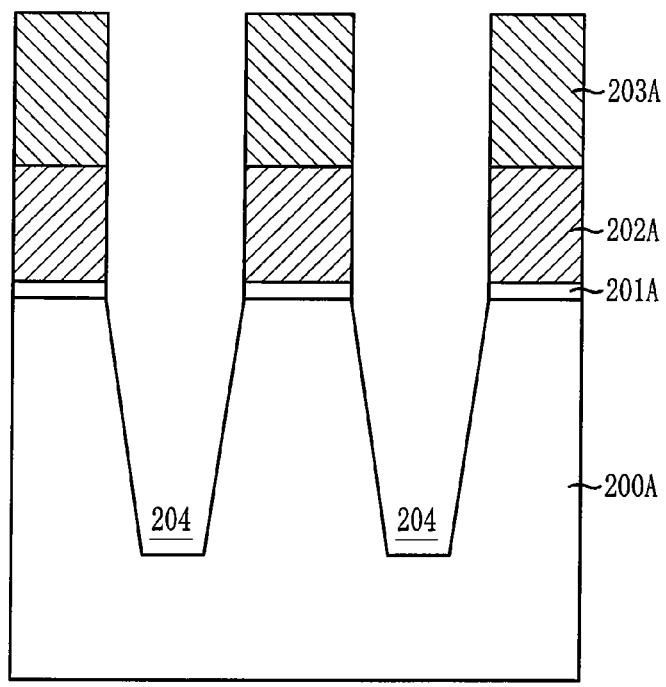

Referring to FIG. 2B, the hard mask 203, the first conductive layer 202, the tunneling insulation layer 201, and the substrate 200 are etched to form trenches 204. Thus, a patterned hard mask 203A, a patterned first conductive layer 202A, a patterned tunneling insulation layer 201A, and a patterned substrate 200A are formed. In a NAND-type flash memory device, the trenches 204 are formed in a line shape. Accordingly, the active region is also defined in a line shape in a direction perpendicular to a word line.

Figure 2C:
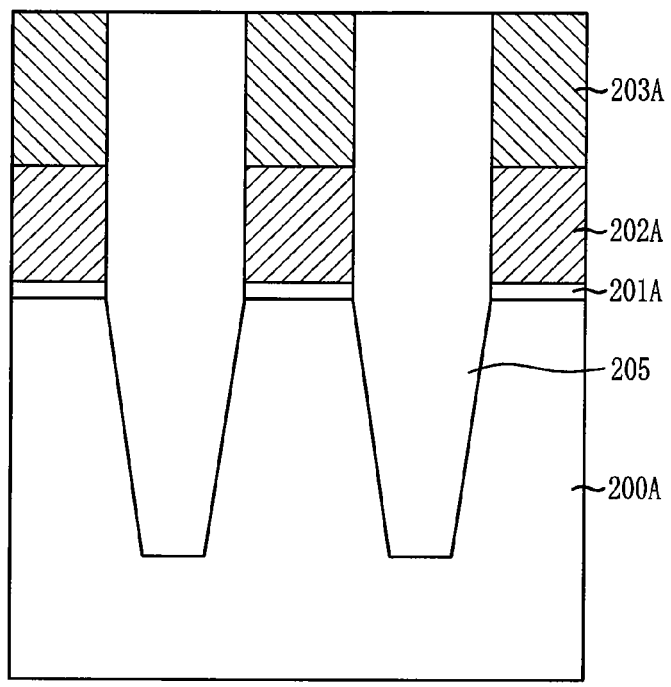

Referring to FIG. 2C, a sidewall protection layer (not shown) may be formed over inner sidewalls of the trenches 204 (FIG. 2B) to compensate for portions damaged while etching the trenches 204 and to adjust a critical dimension (CD) of the active region. A furnace anneal process or an oxidation process using radical ions is performed on the sidewall protection layer at a temperature ranging from approximately 700° C. to approximately 900° C. Also, the sidewall protection layer is formed to a thickness ranging from approximately 30 Å to approximately 80 Å in consideration of a filling characteristic of the trenches 204.

An isolation structure 205 is filled in the trenches 204. The isolation structure 205 is formed by deposition and planarization processes. The planarization process includes an etch-back process or a chemical mechanical polishing (CMP) process. When performing the CMP process, the patterned hard mask 203A is used as a polish stop layer. A slurry having a high polish selectivity ratio between the patterned hard mask 203A and the isolation structure 205 is used to minimize damage to the patterned hard mask 203A. Damage to the patterned hard mask 203A is minimized because a height of a subsequent control gate decreases when the thickness of the patterned hard mask 203A decreases.

The isolation structure 205 may include an undoped silicate glass (USG) layer deposited using a high density plasma-chemical vapor deposition (HDP-CVD) method having a sufficient level of a filling characteristic in a high aspect ratio. Such a USG layer is referred to hereinafter as a HDP layer. The isolation structure 205 may also be formed in a stack structure including a HDP layer and a spin on dielectric (SOD) layer. For instance, the stack structure is configured with the HDP layer, the SOD layer, and the HDP layer, stacked in a linear type structure. A linear type structure generally includes a lower portion formed to a larger thickness than inner sidewalls. That is, a thickness difference between the inner sidewalls and the lower portion of the trenches 204 ranges from approximately 1:10 to approximately 1:5. For instance, the inner sidewalls have a thickness of approximately 150 Å and the lower portion has a thickness of approximately 1,500 Å. Also, the HDP layer, which is a top surface layer, is formed using a deposition-etch-deposition (DED) or a deposition-etch-deposition-etch-deposition (DEDED) method to increase a filling characteristic. Also, the SOD layer includes a polysilazane (PSZ) layer.

Figure 2D:
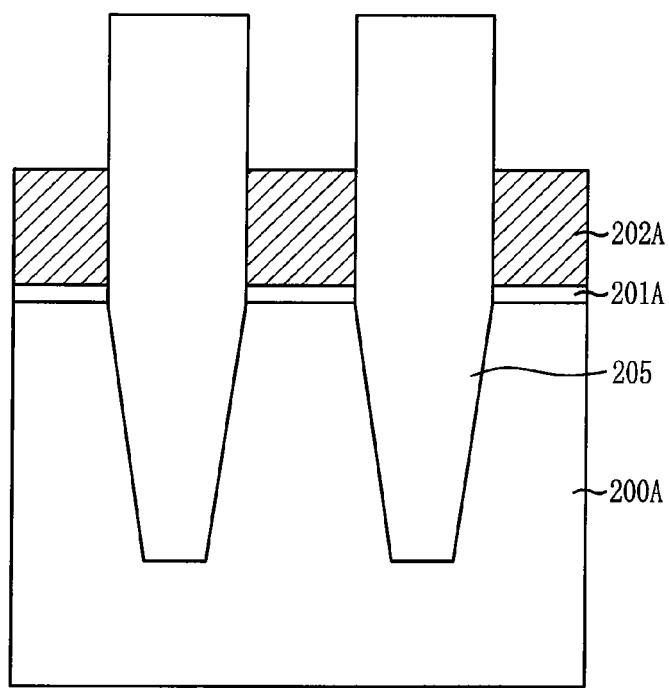

Referring to FIG. 2D, the patterned hard mask 203A (FIG. 2C) is removed. For instance, the patterned hard mask 203A is removed using a buffered oxide etchant (BOE) solution and a phosphoric acid ($H_3PO_4$) solution, or using a diluted hydrogen fluoride (HF) solution and a $H_3PO_4$ solution. The BOE solution includes HF and $NH_4F$ at a ratio of approximately 300:1. The diluted HF solution includes HF and deionized water (DIW) at a ratio of approximately 100:1.

Figure 2E:
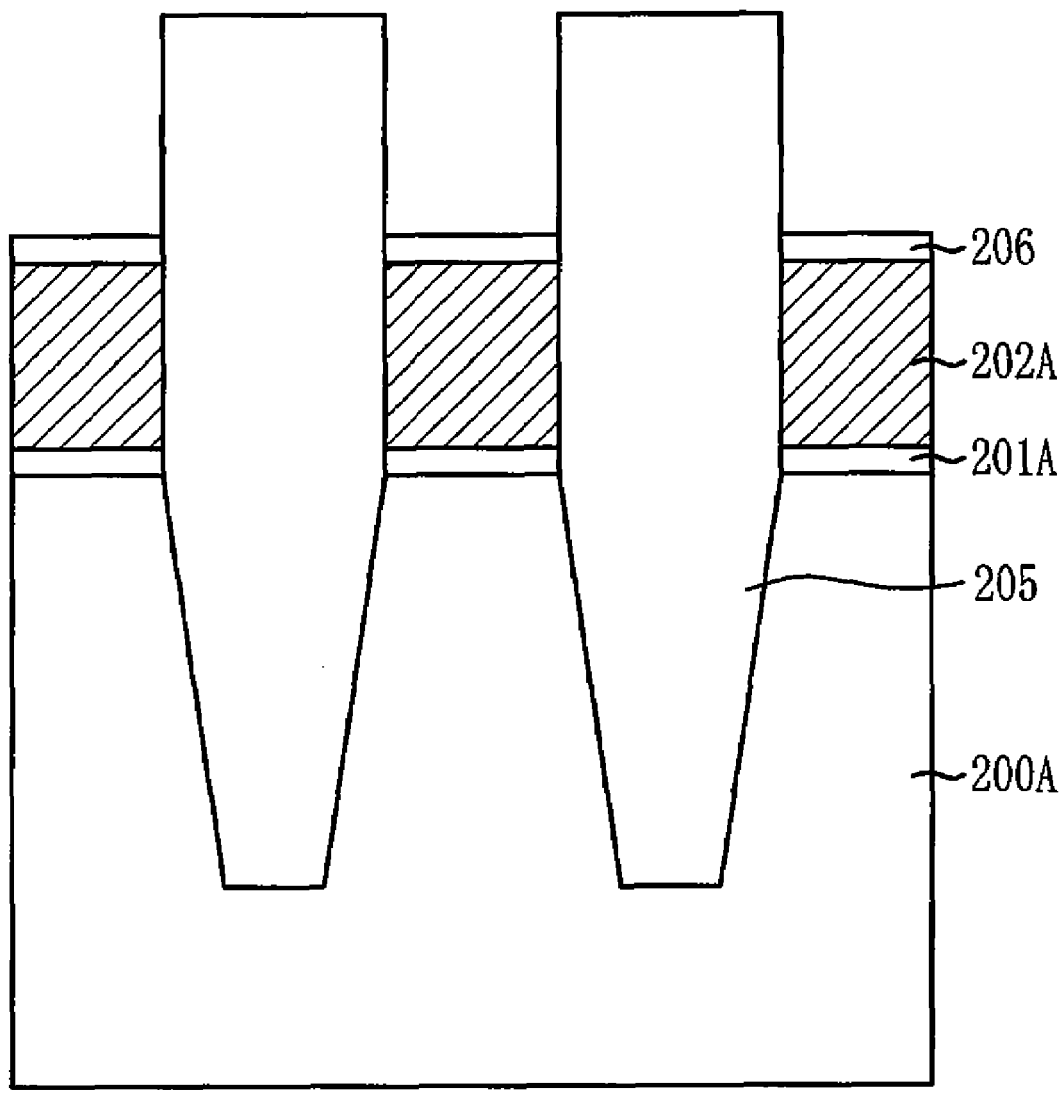

Referring to FIG. 2E, a dielectric layer 206 is formed over the patterned first conductive layer 202A. The dielectric layer 206 may include a stack structure configured with an oxide-based layer, a nitride-based layer, and an oxide-based layer. Also, the dielectric layer 206 may include a high-k dielectric layer having a dielectric constant of approximately 3.9 or greater, or a combined layer or a stack structure of such high-k dielectric layers. The dielectric constant of the high-k dielectric layer is greater than that of a silicon oxide layer. For example, the dielectric layer 206 includes metal oxide. The metal oxide includes an aluminum oxide layer, a zirconium oxide layer, and a hafnium oxide layer. Although not shown, the dielectric layer 206 can be formed over the isolation structure 205.

Figure 2F:
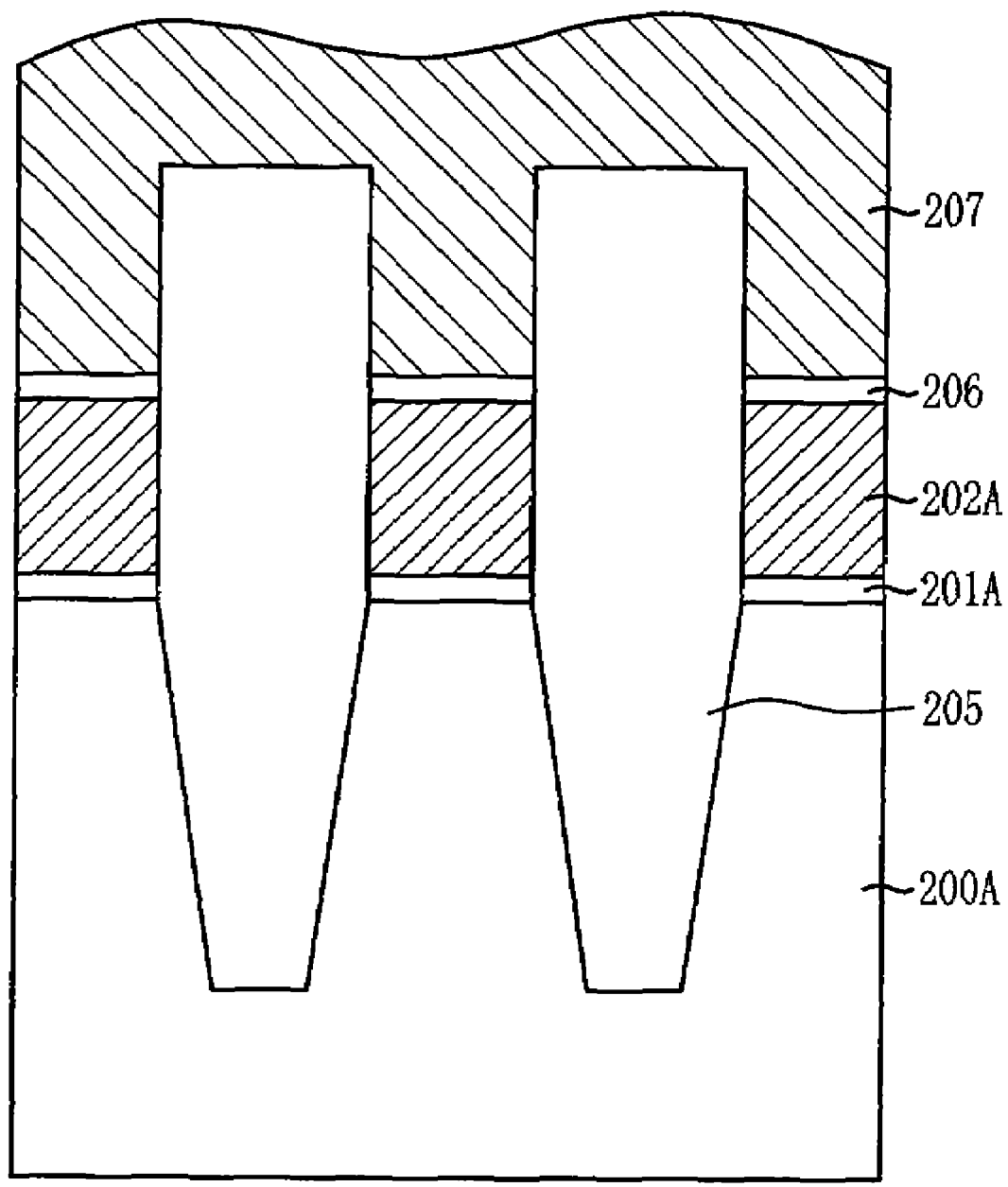

Referring to FIG. 2F, a second conductive layer 207 for forming a control gate is formed over the isolation structure 205 and the dielectric layer 206. The second conductive layer 207 includes substantially the same material as the patterned first conductive layer 202A or some other material which can be used as the patterned first conductive layer 202A. For instance, the second conductive layer 207 includes a doped poly-crystalline silicon layer.

Figure 2G:
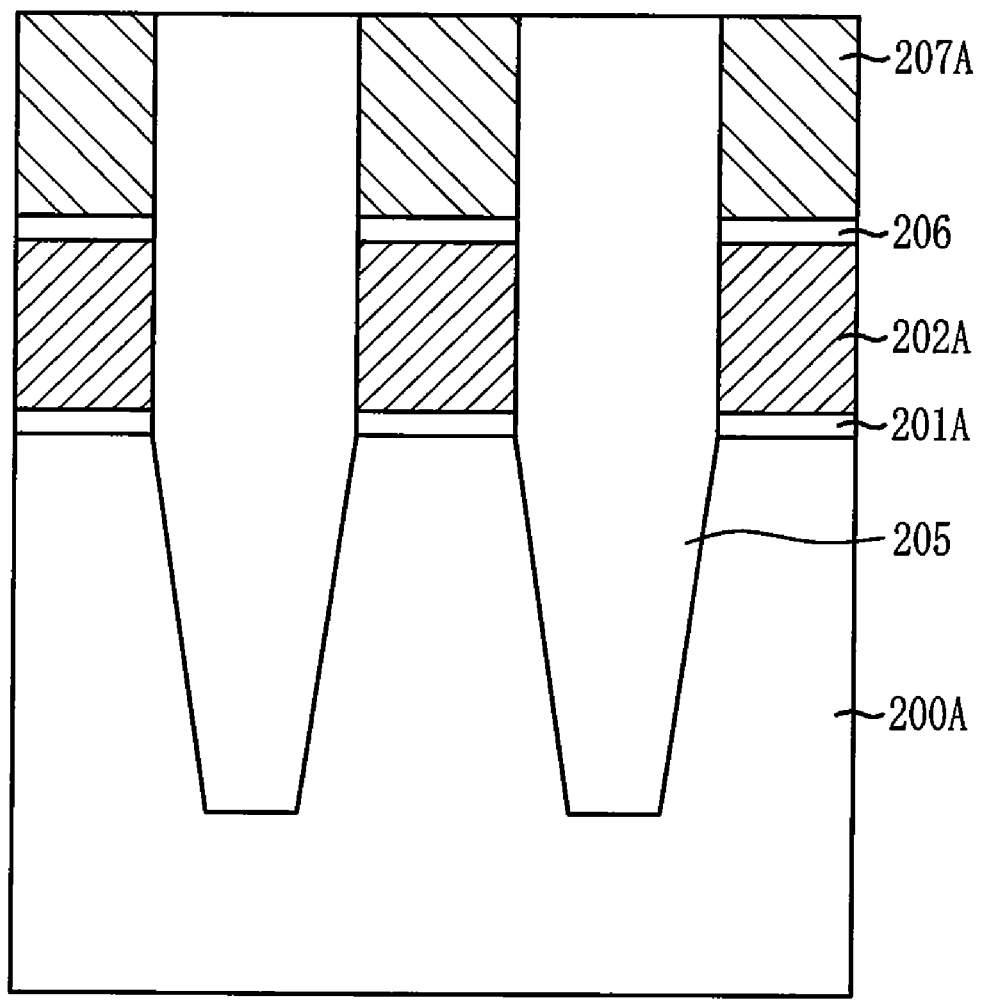

Referring to FIG. 2G, the second conductive layer 207 is planarized and self-aligned using the isolation structure 205. Reference numeral 207 represents a planarized second conductive layer 207A. The planarization process includes a CMP process. The planarized second conductive layer 207A remains with a thickness ranging from approximately 500 Å to approximately 1,500 Å after the CMP process.

The CMP process includes performing two steps to secure polish uniformity. During the first step, the second conductive layer 207 is selectively polished by controlling a polishing time using a high polish selectivity ratio between the isolation structure 205 and the second conductive layer 207. The second step of the CMP process is performed using a lower polish selectivity ratio than the one used in the first step.

For instance, Tables 1 and 2 show conditions of a slurry used during the CMP process when the second conductive layer 207 includes a poly-crystalline silicon layer and the isolation structure 205 includes a HDP layer. Table 1 corresponds to the first step of the CMP process. Table 2 corresponds to the second step of the CMP process.

TABLE 1

| Abrasive | Particle size | Acidity (pH) | Poly-crystalline layer removal rate |
|---|---|---|---|
| Silica (SiO$_2$) | 30 nm to 50 nm, 60 nm to 100 nm | 9.5 to 12 | 3,000 Å/min to 4,500 Å/min |

| WIWNU(% 1-sigma) | Oxide layer removal rate | Selectivity ratio (poly-crystalline silicon layer: oxide layer) | Surface roughness | Dilution multiple |
|---|---|---|---|---|
| 3% to 4% or greater | 50 Å/min or less | 100:1 to 200:1 | 50 Å or less | 5 to 10 |

As shown in Table 1, colloidal silica is used as an abrasive during the first step of the CMP process. Particles including primary particles having a size ranging from approximately 30 nm to approximately 50 nm and secondary particles having a size ranging from approximately 60 nm to approximately 100 nm are used. Also, acidity (pH) is maintained in a range of approximately 9.5 to 12. Also, a polish selectivity ratio of the poly-crystalline silicon layer to the oxide-based layer ranges from approximately 100:1 to approximately 200:1. A removal rate of the poly-crystalline silicon layer ranges from approximately 3,000 Å/min to approximately 4,500 Å/min. A removal rate of the oxide-based layer is approximately 50 Å/min or less. For instance, the removal rate of the oxide-based layer ranges from approximately 10 Å to approximately 50 Å. Also, a within wafer non-uniformity (WIWNU) is approximately 3% to approximately 4% or greater. A surface roughness is approximately 50 Å or less. For instance, the surface roughness ranges from approximately 5 Å to approximately 50 Å. A concentration of the DIW in the slurry is approximately five to approximately ten times thicker than the abrasive.

TABLE 2

| Abrasive | Particle size | Acidity (pH) | Poly-crystalline layer removal rate |
|---|---|---|---|
| Silica (Sio2) | 30 nm to 60 nm, 70 nm to 100 nm | 9 to 11 | 3,000 Å/min to 4,500 Å/min |

| WIWNU(% 1-sigma) | Oxide layer removal rate | Selectivity ratio (poly-crystalline silicon layer: oxide layer) | Concentration (wt %) |
|---|---|---|---|
| 3% to 4% or greater | 2,500 Å/min or less | Greater than 1:1 to 2:1 | 15 to 20 |

As shown in Table 2, colloidal silica is used as an abrasive during the second step of the CMP process. Particles including primary particles having a size ranging from approximately 30 nm to approximately 60 nm and secondary particles having a size ranging from approximately 70 nm to approximately 100 nm are used. Also, acidity (pH) is maintained in a range of approximately 9 to 11. Also, a polish selectivity ratio of the poly-crystalline silicon layer to the oxide-based layer ranges from approximately 1:1 to approximately 2:1. Thus, the second conductive layer is polished at a greater rate than the isolation structure.

A removal rate of the poly-crystalline silicon layer ranges from approximately 3,000 Å/min to approximately 4,500 Å/min. A removal rate of the oxide-based layer is approximately 2,500 Å/min or less. For instance, the removal rate of the oxide-based layer ranges from approximately 1,500 Å to approximately 2,500 Å. A concentration of the abrasive used in the slurry ranges from approximately 15 wt % to approximately 20 wt %.

As shown in Tables 1 and 2, the polish selectivity ratio between the poly-crystalline silicon layer and the oxide-based layer is lower during the second step than the first step because a dishing event may occur when the polish selectivity ratio of the poly-crystalline silicon layer to the oxide layer is high. The dishing event refers to a poly-crystalline silicon layer having a depressed upper surface compared to that of an isolation structure. Thus, the polish selectivity ratio of the poly-crystalline silicon layer to the oxide layer is lowered to decrease an occurrence of the dishing event during the second step.

The CMP process may use a 'mirra' device of AMT or 'EBARA' device. When using the 'mirra' device of AMT and the 'EBARA' device, the polishing process is performed under the following conditions shown in Tables 3 and 4.

TABLE 3

| Membrane pressure (lb) | Retainer ring pressure (lb) | Inner tube pressure (lb) | Platen velocity (rpm) | Head velocity (rpm) |
|---|---|---|---|---|
| 2 to 5 | 2 to 6 | 2 to 5 | 53 to 103 | 47 to 97 |

TABLE 4

| Chamber pressure (hPa) | Retainer ring pressure (hPa) | Main air pressure (hPa) | Center air bag pressure (hPa) | Turn table velocity (rpm) | Top ring velocity (rpm) |
|---|---|---|---|---|---|
| 200 to 500 | 250 to 600 | 350 to 450 | 300 to 500 | 53 to 83 | 47 to 97 |

A word line (not shown) is formed over the planarized second conductive layer 207A in a perpendicular direction to the active region. The word line includes a conductive material. For instance, the word line includes a doped poly-crystalline silicon layer, a transition metal, or a rare earth metal. The word line may include a stack structure configured with a metal nitride or a metal silicide layer in addition to the doped poly-crystalline silicon layer, the transition metal, or the rare earth metal. For instance, the metal nitride includes a tungsten nitride (WN) layer and the metal silicide layer includes a tungsten silicide (WSi) layer.

FIGS. 3A to 3D illustrate cross-sectional views of a method for fabricating a nonvolatile memory device in accordance with a second embodiment of the present invention.

Figure 3A:
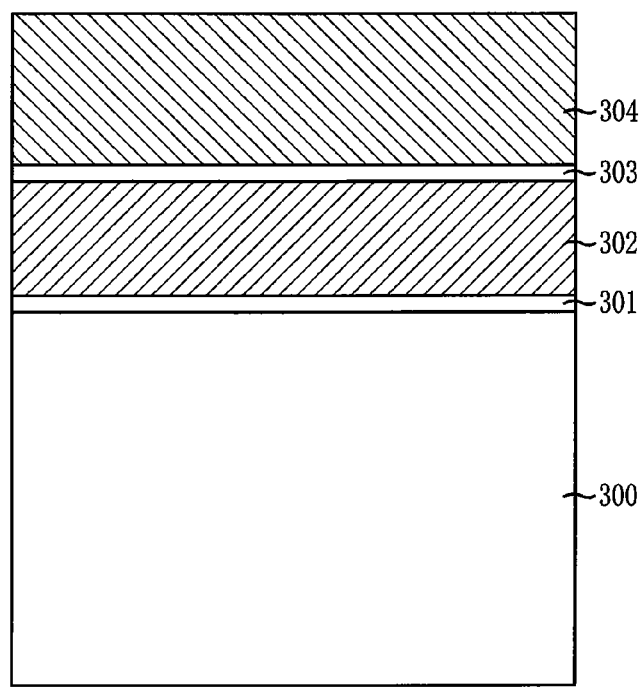
FIGS. 3A to 3D illustrate cross-sectional views of a method for fabricating a nonvolatile memory device in accordance with a second embodiment of the present invention.
Figure 3B:
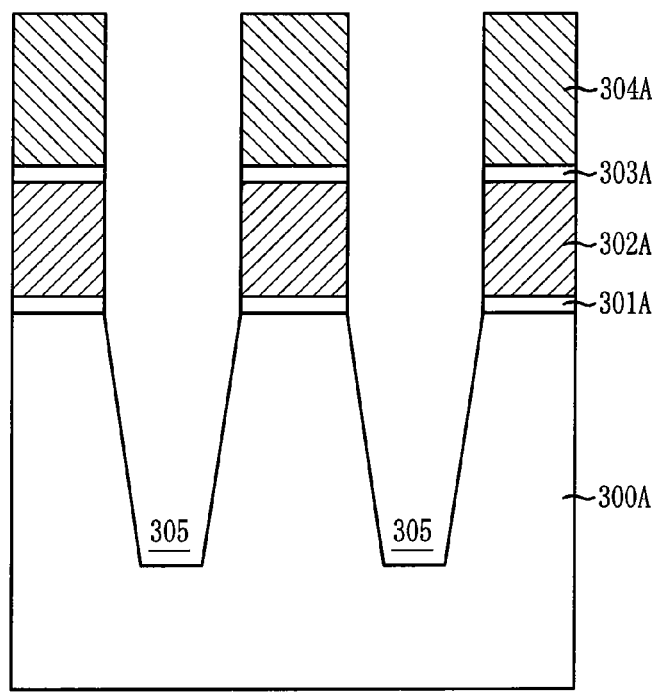

Referring to FIGS. 3A and 3B, a first conductive layer 302 for forming a floating gate and a second conductive layer 304 for forming a control gate are formed over a substrate 300, and trenches 305 are then formed, unlike the first embodiment of the present invention. Other processes are substantially the same as those shown in the first embodiment. In more detail, the substrate 300 is formed as shown in FIG. 3A. A first tunneling insulation layer 301 is formed over the substrate 300. The first conductive layer 302 is formed over the first tunneling insulation layer 301. A dielectric layer 303 is formed over the first conductive layer 302. The second conductive layer 304 is formed over the dielectric layer 303.

Figure 3C:
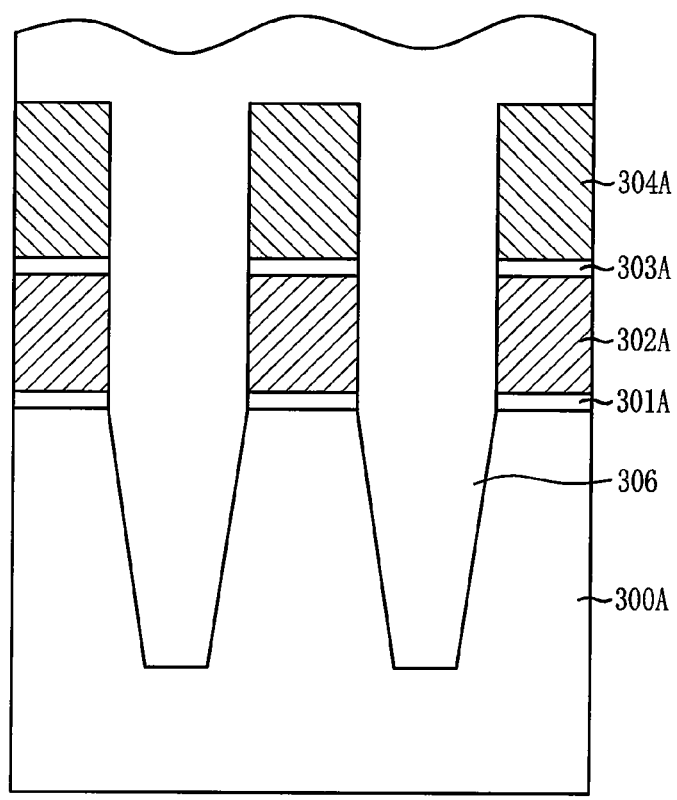

Referring to FIG. 3B, the second conductive layer 304, the dielectric layer 303, the first conductive layer 302, the first tunneling insulation layer 301, and the substrate 300 are etched to form trenches 305. Thus, a patterned second conductive layer 304A, a patterned dielectric layer 303A, a patterned first conductive layer 302A, a patterned first tunneling insulation layer 301A, and a patterned substrate 300A are formed. Referring to FIG. 3C, an isolation structure 306 is filled in the trenches 305. (FIG. 3B)

Figure 3D:
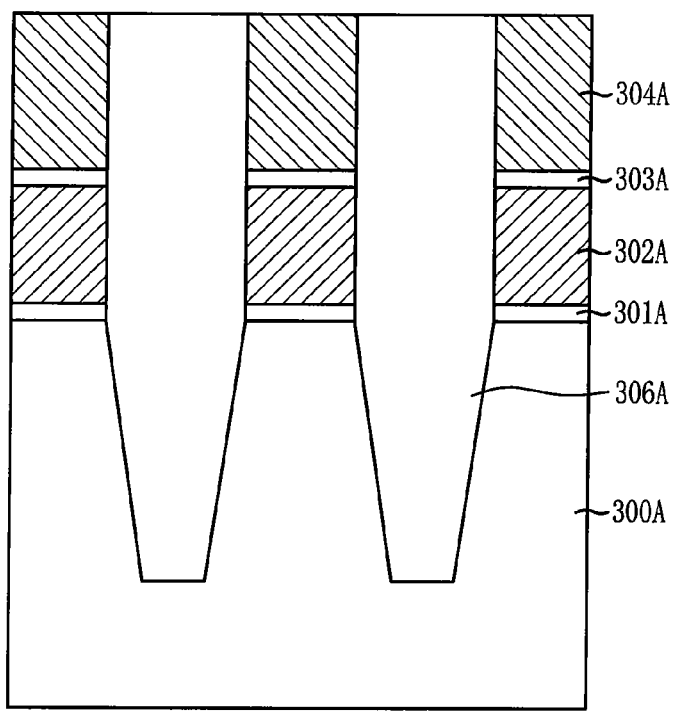

Referring to FIG. 3D, the isolation structure 306 is planarized using a CMP process. Thus, a planarized isolation structure 306A is formed. However, the CMP process performed to planarize the isolation structure 306 is different from the CMP process performed in the first embodiment. That is, a polish target layer in the first embodiment is the poly-crystalline silicon layer, but a polish target layer in the second embodiment is an oxide-based layer, i.e., the isolation structure 306. Accordingly, a CMP process condition in the second embodiment is different from that used in the first embodiment.

For instance, the CMP process includes performing two steps in the second embodiment. A polish rate of a poly-crystalline silicon layer, i.e., the patterned second conductive layer 304A, is higher than that of the oxide-based layer during the first step, unlike the first embodiment. That is, the polish selectivity ratio of the poly-crystalline silicon layer to the oxide-based layer ranges from approximately 1:100 to approximately 1:200 in the first step. The polish selectivity ratio of the poly-crystalline silicon layer to the oxide-based layer ranges from approximately 1:1 to approximately 1:2, where the isolation structure is polished at a greater rate than the second conductive layer, in the second step. Such a polish selectivity ratio may be embodied by adjusting a slurry condition. Thus, the first polish selectivity ratio of the isolation structure to the second conductive layer is approximately 50 to approximately 200 times greater than the second polish selectivity ratio.

According to the embodiments of the present invention, the following benefits may be obtained. A height difference caused by the control gate is removed by self-aligning the upper surface of the control gate using the upper surface of the isolation structure. Thus, the height non-uniformity among the memory cells in the wafer is reduced.

Also, according to the embodiments of the present invention, the polishing process to self-align the upper surface of the control gate using the upper surface of the isolation structure includes performing two steps. Each step uses a different polish selectivity ratio. Non-uniformity limitations such as the dishing event may be substantially reduced by using a low polish selectivity ratio between the control gate and the isolation structure during the second step.

While the present invention has been described with respect to specific embodiments, it will be apparent to those skilled in the art that various changes and modifications may be made without departing from the spirit and scope of the invention as defined in the following claims.

What is claimed is:

1. A method for fabricating a nonvolatile memory device, the method comprising:
  forming a tunneling insulation layer, a first conductive layer for forming a floating gate, and a hard mask over a substrate;
  etching a portion of the hard mask, the first conductive layer, the tunneling insulation layer, and the substrate to form a trench;
  forming an isolation structure to fill in the trench;
  removing the etched hard mask such that an upper portion of the isolation structure protrudes above the etched first conductive layer;
  forming a dielectric layer over the etched first conductive layer;
  forming a second conductive layer for forming a control gate over the isolation structure and the dielectric layer; and
  polishing the second conductive layer to align an upper surface of the second conductive layer using an upper surface of the isolation structure,
  wherein polishing the second conductive layer comprises:
  polishing the second conductive layer using a first polish selectivity ratio between the isolation structure and the second conductive layer while using the isolation structure as a polish stop layer; and
  polishing the isolation structure and the remaining second conductive layer using a second polish selectivity ratio which is lower than the first polish selectivity ratio.

2. The method of claim 1, wherein the first polish selectivity ratio of the isolation structure to the second conductive layer is approximately 50 to approximately 200 times greater than the second polish selectivity ratio.

3. The method of claim 1, wherein the first polish selectivity ratio of the isolation structure to the second conductive layer ranges from approximately 100:1 to approximately 200:1 and the second polish selectivity ratio thereof ranges from approximately 1:1 to approximately 2:1, the second conductive layer being polished at a greater rate than the isolation structure.

4. The method of claim 1, wherein polishing the second conductive layer comprises using a silica abrasive.

5. The method of claim 4, wherein polishing the second conductive layer using the first polish selectivity ratio comprises using particles including primary particles having a size ranging from approximately 30 nm to approximately 50 nm and secondary particles having a size ranging from approximately 60 nm to approximately 100 nm, and polishing the isolation structure and the remaining second conductive layer comprises using particles including primary particles having a size ranging from approximately 30 nm to approximately 60 nm and secondary particles having a size ranging from approximately 70 nm to approximately 100 nm.

6. The method of claim 4, wherein polishing the second conductive layer using the first polish selectivity ratio comprises using a slurry having acidity (pH) ranging from approximately 9.5 to approximately 12, and polishing the isolation structure and the remaining second conductive layer comprises using a slurry having acidity (pH) ranging from approximately 9 to approximately 11.

7. The method of claim 4, wherein polishing the second conductive layer using the first polish selectivity ratio is performed such that a surface roughness ranging from approximately 1 Å to approximately 50 Å is obtained.

8. The method of claim 4, wherein polishing the second conductive layer is performed such that a thickness of the remaining second conductive layer ranges from approximately 500 Å to approximately 1,500 Å.

9. The method of claim 1, the isolation structure comprises an oxide-based layer, and the second conductive layer comprises a poly-crystalline silicon layer.

10. A method for fabricating a nonvolatile memory device, the method comprising:

forming a tunneling insulation layer, a first conductive layer for forming a floating gate, a dielectric layer, and a second conductive layer for forming a control gate over a substrate;

etching a portion of the second conductive layer, the dielectric layer, the first conductive layer, the tunneling insulation layer, and the substrate to form a trench;

forming an isolation structure over the etched second conductive layer to fill in the trench; and polishing the isolation structure to align an upper surface of the isolation structure using an upper surface of the etched second conductive layer, wherein polishing the isolation structure comprises:

polishing the isolation structure using a first polish selectivity ratio between the second conductive layer and the isolation structure while using the second conductive layer as a polish stop layer; and polishing the second conductive layer and the remaining isolation structure using a second polish selectivity ratio which is lower than the first polish selectivity ratio.

11. The method of claim 10, wherein the first polish selectivity ratio of the second conductive layer to the isolation structure is approximately 50 to approximately 200 times greater than the second polish selectivity ratio.

12. The method of claim 10, wherein the first polish selectivity ratio of the second conductive layer to the isolation structure ranges from approximately 1:100 to approximately 1:200 and the second polish selectivity ratio thereof ranges from approximately 1:1 to approximately 1:2, the isolation structure being polished at a greater rate than the second conductive layer.

13. The method of claim 10, wherein the second conductive layer is formed to a thickness ranging from approximately 500 Å to approximately 1,500 Å.

14. The method of claim 10, wherein the isolation structure comprises an oxide-based layer, and the second conductive layer comprises a poly-crystalline silicon layer.

* * * * *